United States Patent [19]
Brunner

[11] Patent Number: 5,742,098
[45] Date of Patent: Apr. 21, 1998

[54] SEMICONDUCTOR COMPONENT WITH PLASTIC SHEATH AND METHOD FOR PRODUCING THE SAME

[75] Inventor: Herbert Brunner, Rebensburg, Germany

[73] Assignee: Siemens Aktiengesellschaft, Munich, Germany

[21] Appl. No.: 616,319

[22] Filed: Mar. 15, 1996

[30] Foreign Application Priority Data

Mar. 15, 1995 [DE] Germany ............ 195 09 262.7

[51] Int. Cl.⁶ ............ H01L 23/04; H01L 23/28; H01L 33/00; H05K 5/00
[52] U.S. Cl. ............ 257/730; 257/787; 257/99; 257/100; 257/784; 361/759; 361/740; 361/726
[58] Field of Search ............ 257/730, 781, 257/782, 784, 99, 100; 361/740, 726, 759; 174/52.6, 102 SC

[56] References Cited

U.S. PATENT DOCUMENTS

| | | | |
|---|---|---|---|
| 4,712,129 | 12/1987 | Orcutt | 257/783 |
| 5,122,860 | 6/1992 | Kikuchi et al. | 257/679 |
| 5,164,815 | 11/1992 | Lim | 257/618 |
| 5,249,732 | 10/1993 | Thomas | 437/183 |

FOREIGN PATENT DOCUMENTS

| | | | |
|---|---|---|---|
| 4327133 | 2/1995 | Germany. | |
| 57-210637 | 12/1982 | Japan | 257/796 |
| 59-163841 | 9/1984 | Japan. | |
| 62-213267 | 9/1987 | Japan. | |
| 4-359529 | 12/1992 | Japan. | |

OTHER PUBLICATIONS

Patent Abstracts of Japan, E-1397, Jul. 14, 1993, vol. 17, No. 375: & JP-A-5-63112 (Sony) Mar. 12, 1993.
J. Appl. Phys. 75 (11) Jun. 1, 1994 (Petri) pp. 7498-7506 "Silicon roughness induced by plasma etching".

*Primary Examiner*—Mahshid D. Saadat
*Assistant Examiner*—Jhihan B. Clark
*Attorney, Agent, or Firm*—Herbert L. Lerner; Laurence A. Greenberg

[57] ABSTRACT

A semiconductor component includes a semiconductor body. At least one contact metallizing covers at least one portion of a surface of the semiconductor body, defining at least one free portion of the surface not covered by the at least one contact metallizing. A plastic sheath adjoins the semiconductor body having the at least one contact metallizing. The at least one free portion of the surface has a roughening forming a microscopic toothing between the semiconductor body and the plastic sheath. A method for producing a semiconductor component includes producing a semiconductor body, contact metallizings on the semiconductor body, and a microscopic tooth structure on a surface of the semiconductor body. The semiconductor body with the contact metallizings and the microscopic tooth structure is mounted on a system substrate. At least one terminal lead is bonded to one of the contact metallizings and to terminal prongs of the system substrate. The semiconductor body, the contact metallizings, the at least one terminal lead, portions of the terminal prongs and at least portions of the system substrate are sheathed with plastic, while penetrating, filling and curing the plastic in the microscopic tooth structure.

4 Claims, 1 Drawing Sheet

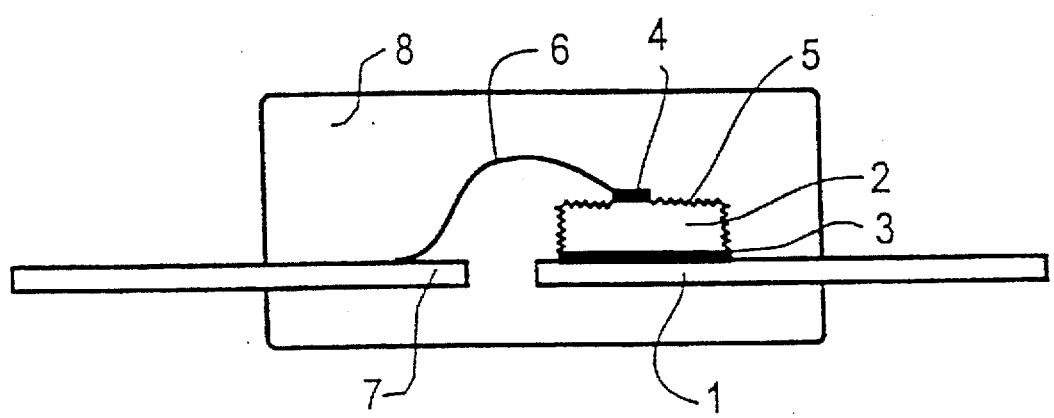

SEMICONDUCTOR COMPONENT WITH PLASTIC SHEATH AND METHOD FOR PRODUCING THE SAME

BACKGROUND OF THE INVENTION

FIELD OF THE INVNETION

The invention relates to a semiconductor component, in which a plastic sheath adjoins a semiconductor body having at least one contact metallizing. The invention also relates to a method for producing the semiconductor component.

One such semiconductor component is known, for instance, from German Published, Non-Prosecuted Patent Application DE 43 27 133 A1. That reference describes a semiconductor component in which a light emitting diode is optically coupled to a light-detecting semiconductor chip, through a transparent plastic sheath. The transparent plastic sheath is applied directly to the surface of the semiconductor body of the light-emitting diode and of the light-detecting semiconductor chip.

The coefficients of thermal expansion of known sheathing plastics, such as epoxy resins and semiconductor materials, vary greatly ($\alpha_{th}$ (epoxy resins)=60–200*10$^{-6}$ K$^{-1}$; $\alpha_{th}$ (GaAs)=6*10$^{-6}$ K$^{-1}$; $\alpha_{th}$ (Si)=2.5*10$^{-6}$ K$^{-1}$). Mechanical strains thus arise in the semiconductor component given the temperature fluctuations that typically occur during operation of a semiconductor component. Over the course of time, that mechanical strain and attendant shear forces at a boundary surface between the semiconductor body and the plastic sheath can cause detachment of the plastic sheath from the semiconductor body. In most cases, however, detachment of the plastic sheath causes a marked impairment of the functional properties of the semiconductor component. For instance, in a semiconductor component for sending and/or receiving optical signals, detachment of the sheath from the semiconductor body causes considerable light losses. Provisions are therefore needed that increase the strength of adhesion between the semiconductor body and the plastic sheath.

Known provisions for increasing the adhesive strength between the semiconductor body and the plastic sheath are as follows:

adaptation of the coefficient of thermal expansion of the plastic sheath material;

activation of the semiconductor surface, for instance by plasma cleaning; and providing an intermediate layer between the semiconductor surface and the plastic sheath.

Suitable adaptation of the coefficient of thermal expansion of known plastic sheath materials, such as epoxy resins, has thus far been attainable only by the addition of fillers. Known fillers are metal powder, metal oxides, metal carbonates and metal silicates.

Since such fillers, aside from the thermal coefficient of expansion, also impair the light transmission of a plastic sheath material, the use of fillers is possible only in those cases where that property does not play an essential role.

Activating the semiconductor surface or providing an intermediate layer as an adhesion promoter between the semiconductor surface and the plastic sheath has the disadvantage of requiring additional, complicated and expensive method steps.

SUMMARY OF THE INVENTION

It is accordingly an object of the invention to provide a semiconductor component with a plastic sheath and a method for producing the semiconductor component, which overcome the hereinafore-mentioned disadvantages of the heretoforeknown devices and methods of this general type and which provide increased adhesion strength between the semiconductor body and the plastic sheath, without requiring one of the provisions listed above.

With the foregoing and other objects in view there is provided, in accordance with the invention, a semiconductor component, comprising a semiconductor body having a surface; at least one contact metallizing covering at least one portion of the surface of the semiconductor body, defining at least one free portion of the surface of the semiconductor body not covered by the at least one contact metallizing; and a plastic sheath adjoining the semiconductor body having the at least one contact metallizing; the at least one free portion of the surface of the semiconductor body having a roughening forming a microscopic toothing between the semiconductor body and the plastic sheath.

Through the use of the microscopic teeth, on one hand the area at which the surface of the semiconductor body adjoins the plastic sheath is increased. On the other hand, the microscopic toothing distributes the mechanical strains into the interior of the semiconductor body and the sheath. Both factors produce an advantageous reduction in the shear forces at the contact surface between the semiconductor body and the plastic sheath.

In accordance with another feature of the invention, the contact metallizing contains aluminum.

In accordance with a further feature of the invention, the contact metallizing is an aluminum-based alloy.

With the objects of the invention view there is also provided, a method for producing a semiconductor component, which comprises producing a semiconductor body having a surface; producing contact metallizings on the semiconductor body; producing a microscopic tooth structure on the surface of the semiconductor body; mounting the semiconductor body with the contact metallizings and the microscopic tooth structure, on a system substrate; bonding at least one terminal lead to one of the contact metallizings and to terminal prongs of the system substrate; and sheathing the semiconductor body, the contact metallizings, the at least one terminal lead, portions of the terminal prongs and at least portions of the system substrate with plastic, while penetrating, filling and curing the plastic in the microscopic tooth structure.

Other features which are considered as characteristic for the invention are set forth in the appended claims.

Although the invention is illustrated and described herein as embodied in a semiconductor component with a plastic sheath and a method for producing the semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The FIGURE of the drawing is a cross-sectional view of a semiconductor component according to the invention, such as a light-emitting diode.

DESCRIPTION OF THE PREFERRED EMBODIMENT

Referring now in detail to the single figure of the drawing, there is seen a semiconductor body 2 which has one respective contact metallizing 3, 4 on each of its lower surface and its upper surface, on a terminal prong 1 of a system substrate. By way of example, the semiconductor body 2 is formed of $Al_xGa_{1-x}As$, $In_xGa_{1-x}As$, Si, or SiC. The contact metallizings 3, 4 may be formed of aluminum, an aluminum-based alloy, or some other non-noble metal material. The semiconductor body 2 has surfaces that are not provided with a contact metallizing 3, 4. Those surfaces have a microscopic tooth structure 5 that can be made, for instance, by etching. The contact metallizing 3 is electrically conductively connected to the terminal prong 1, for instance by a lead/tin solder. The contact metallizing 4 is electrically conductively connected to a terminal prong 7 through the use of a bond wire 6, for instance a gold wire. The semiconductor body 2, the contact metallizings 3, 4, the bond wire 6, and portions of the terminal prongs 1, 7 are sheathed with a transparent plastic sheath 8, for instance of epoxy resin. The microscopic tooth structure 5 not only provides improved adhesive strength of the plastic sheath 8 to the semiconductor body 2, but additionally provides an improved coupling in and/or out of light, in the case of a light-emitting and/or light-receiving semiconductor body 2, because of reduced total reflection losses at a boundary between the semiconductor body 2 and the plastic sheath 8.

A method for producing the above-described semiconductor component has, for example, the following successive steps:

a) production of the semiconductor body 2, for instance a light-emitting diode or a photodiode;

b) production of contact metallizings 4, 5, for instance by sputtering;

c) production of a microscopic tooth structure 5, for instance by etching onto the surface of the semiconductor body 2;

d) mounting of the semiconductor body 2, which is provided with the contact metallizings 3, 4 and the microscopic tooth structure 5, on the connection prong 1 or on an island of the system substrate, for instance by adhesive bonding or soldering;

e) bonding of one or more terminal leads to the contact metallizing 4 and to terminal prong 7; and f) sheathing of the semiconductor body 2 with the microscopic tooth structure 5, the contact metallizings 3, 4, the terminal leads 6 and portions of the terminal prongs 1, 7, with plastic. The sheathing with the plastic is carried out in such a way that the plastic penetrates the microscopic tooth structure 5, fills it, and then cures it. As a result, the microscopic toothing is formed between the semiconductor body 2 and the plastic sheath 8.

A transfer molding process may, for instance, be used as the sheathing process.

A method for producing the microscopic tooth structure 5, for instance on a semiconductor body 2 of one or more layers of $Al_xGa_{1-x}As$ ($0 \leq x \leq 1$), and for producing contact metallizings 3, 4 of a nonnoble metal material, such as aluminum or an aluminum-based alloy, has the following successive steps, for instance:

a) precleaning of the surface of the semiconductor body 2 to produce a hydrophilic semiconductor surface, optionally with a commercially available detergent additive; and b) etching of the surface of the semiconductor body 2, for instance with nitric acid (65%). Depending on the aluminum content x, the temperature and the etching duration must be adapted for the etching process. In order to provide an aluminum content of $0.30 \leq x \leq 0.40$, the etching duration is 15 to 30 seconds, for instance at a temperature of $\pm 5°$ C.

Another method for producing the microscopic tooth structure 5, for instance on a semiconductor body 2 of one or more layers of $Al_xGa_{1-x}As$ ($0 \leq x \leq 0.4$), and for producing contact metallizings 3, 4 which have a nonnoble metal material, such as aluminum or an aluminum-based alloy, has the following successive steps, for instance:

a) production of the semiconductor body (2);

b) applications of the contact metallizings (3, 4);

c) precleaning of the semiconductor surface to produce a hydrophilic semiconductor surface, for instance by rinsing with water, and optionally with a detergent additive;

d) roughening etching with an etching mixture of hydrogen peroxide ($\geq 30\%$) and hydrofluoric acid ($\geq 40\%$) (1000:6) over a duration of from 1 to 2.5 minutes; and e) post-etching with a dilute mineral acid, such as sulfuric acid (15%), at 35° C. for a duration of 1 to 2 minutes.

The temperature and the etching duration must be adapted for the roughening etching depending on the aluminum content x.

I claim:

1. A semiconductor component, comprising:

a light-emitting semiconductor body having a surface;

at least one contact metallizing covering at least one portion of said surface of said semiconductor body, defining at least one free portion of said surface of said semiconductor body not covered by said at least one contact metallizing;

a plastic sheath covering said semiconductor body having said at least one contact metallizing; and said at least one free portion of said surface of said semiconductor body having a roughening forming a microscopic toothing, and said plastic sheath having a complementary microscopic toothing for interlocking with said microscopic toothing of said semiconductor body for reducing light transmission loses between said semiconductor body and said plastic sheath.

2. The semiconductor component according to claim 1, wherein said contact metallizing contains aluminum.

3. The semiconductor component according to claim 1, wherein said contact metallizing is an aluminum-based alloy.

4. A semiconductor component, comprising:

a light-receiving semiconductor body having a surface;

at least one contact metallizing covering at least one portion of said surface of said semiconductor body, defining at least one free portion of said surface of said semiconductor body not covered by said at least one contact metallizing;

a plastic sheath covering said semiconductor body having said at least one contact metallizing; and said at least one free portion of said surface of said semiconductor body having a roughening forming a microscopic toothing, and said plastic sheath having a complementary microscopic toothing for interlocking with said microscopic toothing of said semiconductor body for reducing light transmission loses between said semiconductor body and said plastic sheath.

* * * * *